United States Patent [19]
Geddes

[11] Patent Number: 5,939,901
[45] Date of Patent: Aug. 17, 1999

[54] SYNTHESIZABLE FLIP-FLOP BASED PHASE-FREQUENCY COMPARATOR FOR PHASE-LOCKED LOOPS

[75] Inventor: Blaine Quentin Geddes, Kemptville, Canada

[73] Assignee: Northern Telecom Limited

[21] Appl. No.: 08/934,672

[22] Filed: Sep. 22, 1997

[51] Int. Cl.[6] .................................................. H03L 5/26
[52] U.S. Cl. .................................................. 327/3; 327/12
[58] Field of Search .................................. 327/2, 3, 5, 7, 327/10, 12

[56] References Cited

U.S. PATENT DOCUMENTS

| | | |
|---|---|---|
| 4,668,918 | 5/1987 | Adams ........................................ 331/17 |
| 5,315,186 | 5/1994 | Baker ........................................... 327/3 |
| 5,539,345 | 7/1996 | Hawkins ................................... 327/150 |
| 5,631,591 | 5/1997 | Bar-Niv ................................... 327/158 |

Primary Examiner—Tuan T. Lam
Attorney, Agent, or Firm—Pascal & Associates

[57] ABSTRACT

A method of performing phase-frequency comparison comprising the steps of receiving first and second clock signals; comparing the signals by triggering flip-flop circuits controlled by AND gates, and providing a first output when first signal is in advance of the second signal, and a second output when second signal is advance of the first signal.

3 Claims, 2 Drawing Sheets

SYNTHESIZABLE FLIP-FLOP BASED PHASE-FREQUENCY COMPARATOR FOR PHASE-LOCKED LOOPS

The present invention relates to a synthesizable, flip-flop based phase-frequency detector/comparator and more particularly to such a phase-frequency comparator based on flip-flops suitable for use in a phased locked loop (PLL) circuit including a voltage-controlled oscillator (VCO).

BACKGROUND OF THE INVENTION

PLLs including a local VCO are commonly used for maintaining the output of the VCO in frequency and phase with a reference signal.

Typically, the VCO frequency is compared to a fixed reference frequency in order to generate a signal that modifies the VCO frequency up or down until the comparator inputs are not only of the same frequency but also in phase. Such phase-frequency detectors are known, see for example Motorola MC4044, MECL Databook DL122 Rev. 3 Q2/88, and are disclosed for example in U.S. Pat. No. 5,631,582 granted May 20, 1997 to Akio Fujikawa.

As taught by Fujikawa, a circuit as illustrated in FIG. 1 herein and in FIG. 1 of U.S. Pat. No. 5,631,582 is used as a phase-frequency comparator. Reference numerals 20 and 21 represent D-type flip-flops, reference numeral 22 represents an inverter, reference numeral 23 represents an AND gate, reference numeral 26 represents a P-type Metal Oxide Semiconductor Field Effect Transistor (MOSFET) and reference numeral 27 represents an N-type MOSFET. Reference numerals 28a, b and c represent power terminals connected to a power source $V_{DD}$.

The flip-flop 20 has its D input terminal pulled up by the supply voltage $V_{DD}$ through a terminal 28a. To its clock terminal C a digital reference signal $F_{REF}$ is input. The output from the Q terminal of the flip-flop 20 is input to the inverter 22 through a node A and coupled to one input terminal of the AND gate 23. The output of the inverter 22 is input to the gate of the P-type MOSFET 26.

The flip-flop 21 also has its D input terminal pulled up by the supply voltage Vdd through the terminal 28b. A digital signal $F_{VCO}$, the frequency and phase of which is to be compared to the digital reference signal $F_{REF}$, is input. The output from the Q terminal of the flip-flop 21 is coupled to the other input terminal of the AND gate 23 through a node B and input to the gate of the N-type MOSFET 27. The output of the AND gate 23 is connected to the reset input terminals of the flip-flops 20 and 21. When the voltage level of the nodes A and B are both high, the output of the AND circuit 23 is high so that the flip-flops 20 and 21 are reset.

The outputs from the Q terminals of the flip-flops 20 and 21 are used to control the MOSFETs 26 and 27. The output of the comparator appears at node O. The output of the supply voltage $V_{dd}$ appears at node O when MOSFET 26 is on and the output of the ground voltage appears at node O when the MOSFET 27 is on. When both MOSFETs 26 and 27 are off and when there is no input to any of the flip-flops 20 and 21 the output of the comparator is always in a high impedance state.

However, since the output pulse widths at nodes A and B are small when the phase difference between the waveforms $F_{REF\ and\ FVCO}$ is very small, the output pulse may disappear according to the frequency characteristics of the MOSFETs 26 and 27, resulting in a dead band being formed in the input-output characteristics.

SUMMARY OF THE INVENTION

The present invention provides a phase-frequency comparator which offers ease of implementation. The device is a synchronous phase-frequency comparator implementation based on flip-flops and AND gates thereby permitting design synthesis from register transfer level very high-level description language (VHDL) code, an industry standard hardware description language, in a field programmable gate array.

The present invention provides for a more compact implementation and more predictable internal delays, than possible using combinatorial cells.

Advantages of the present invention are that the use of flip-flops, rather than combinatorial cells, allows for easier implementation thereby offering in most Field Programmable Gate Arrays (FPGAs) more predictable operation due to better delay control. It also avoids the use of cross coupled combinatorial gates which complicate and/or prohibit synthesis in the implementation of a synchronous phase-frequency comparator. Flip-flops are highly versatile memory elements because of their high speed of operation, the ease with which information can be stored into and read out of them, and the ease with which they can be interconnected with logic gates.

In accordance with the present invention there is provided an integrated circuit for detecting a phase-frequency relationship between two clock signals, the integrated circuit comprising:

a) at least two logic gates with input terminals receiving first and second clock signals; b) at least four inverters;

c) at least two negative-edge triggered flip-flops receiving the clock signals; and d) at least two positive-edge triggered flip-flops receiving the clock signals, one of the positive-edge triggered flip-flops providing an output when a first clock signal is rising, the other positive-edge triggered flip-flop providing an output when the second clock signal is rising; whereby an indication is provided when one of the clock signals is different from the other.

The present invention provides a method of performing phase-frequency comparison comprising the steps of:

a) receiving first and second clock signals;

b) comparing said signals;

c) providing a first positive pulse when the first signal is before the second signal; and d) providing a second positive pulse when the second signal is before the first signal.

BRIEF DESCRIPTION OF THE DRAWINGS

The present invention will be further understood from the following description with reference to the drawings in which.

DETAILED DESCRIPTION OF THE DRAWINGS

Figure 1:
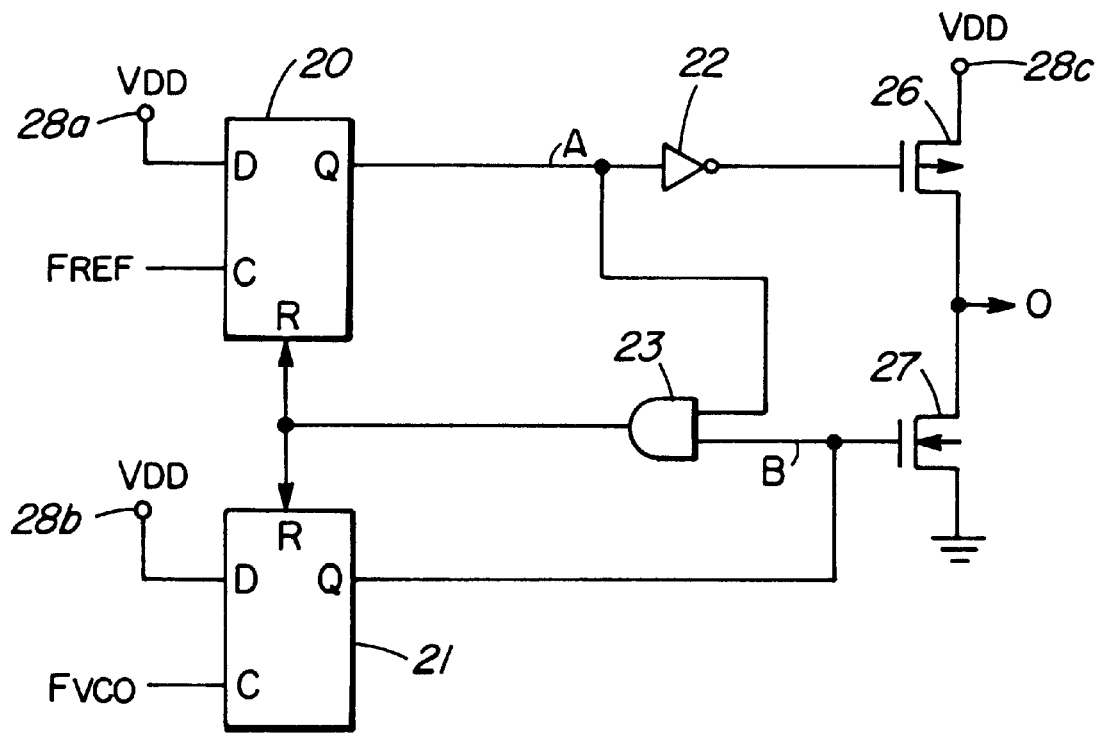
FIG. 1 is a circuit diagram of a known phase-frequency comparator.
Figure 2:
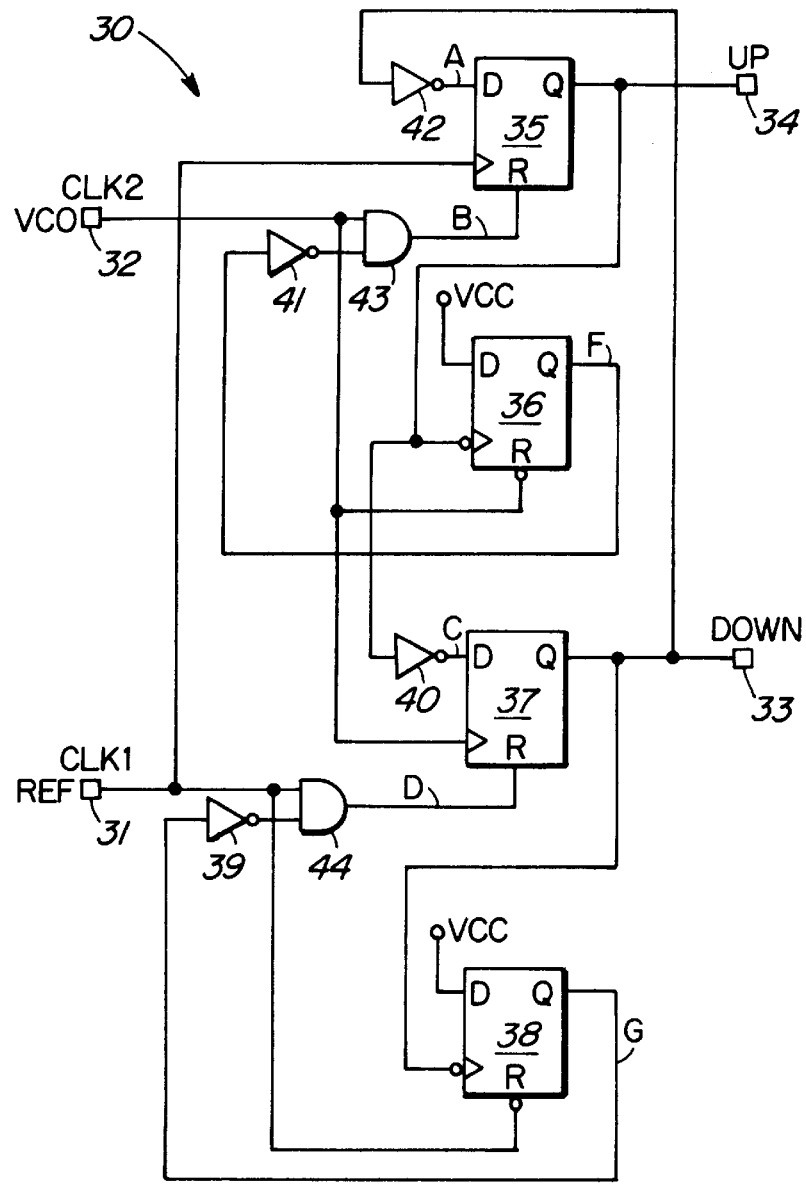
FIG. 2 is a circuit diagram of a flip-flop based phase-frequency comparator of the present invention.

Referring to FIG. 2, there is illustrated a circuit diagram of a phase-frequency comparator in accordance with a preferred embodiment of the present invention. A phase-frequency comparator 30 compares two clock signals, CLK 2, (the VCO clock) and CLK1 (the reference clock), in order to produce phase-frequency correction signals at its UP and DOWN outputs. A positive pulse on UP output 34 indicates that the reference clock is in advance of the VCO clock therefore resulting in a signal indicating that the VCO frequency should be increased. On the other hand, a positive pulse on DOWN output 33 indicates that the VCO clock is in advance of the reference clock therefore resulting in a signal indicating that the VCO clock frequency should be decreased. The UP and DOWN signals are fed to an external integrator (not shown) which controls the VCO frequency in a phase-locked loop.

A reference clock signal CLK1 is input to terminal 31 and a VCO clock signal CLK2 is input to terminal 32, and corresponding DOWN and UP signals are output by comparator 30 at respective outputs 33 and 34. The comparator 30 includes the D flip-flops 35 and 37, which are positive-edge triggered, and D flip-flops 36 and 38, which are negative-edge triggered, these latter operating in a manner so that they respond only to negative going transitions at the clock input. Also the comparator 30 includes inverters 39, 40, 41 and 42 and first and second AND gates 43 and 44.

The reference clock signal, CLK1 at terminal 31, is input to AND gate 44, and to the reset input of flip-flop 38 and to the clock input of flip-flop 35. The Q output of flip-flop 38 is connected through inverter 39 to the second input of AND gate 44. The output of AND gate 44 is connected to the reset of flip-flop 37. The Q output of flip-flop 37 is connected to the clock input of flip-flop 38 and to the D input of flip-flop 35 through inverter 42. The Q output of flip-flop 37 provides the down signal at output 33.

The VCO clock signal CLK2 at input 32 is applied to an input of AND gate 43, to the reset of flip-flop 36 and to the clock input of flip-flop 37. The Q output of flip-flop 36 is connected through inverter 41 to a second input of AND gate 43. The output of AND gate 43 is connected to the reset input of flip-flop 35. The Q output of flip-flop 35 is connected to the clock input of flip-flop 36 and to the D input of flip-flop 37 through inverter 40. The Q output of flip-flop 35 provides the UP signal at output 34.

Figure 3:
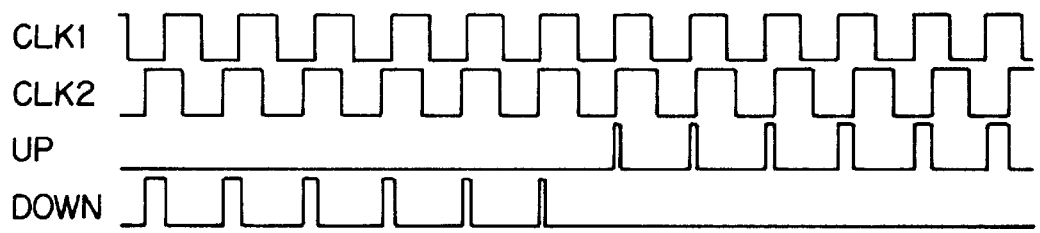
FIG. 3 is a timing diagram of the circuit of FIG. 2.

The operation of the circuit of FIG. 2 may be understood by the following description in conjunction with FIG. 3. When reference clock (CLK1) is in advance of the VCO clock (CLK2), the rising edge of CLK1 triggers the flip-flop 35 which makes the UP signal go logic high. When CLK2 goes logic high, the output of the AND gate 43 goes logic high (at that time the Q output of flip-flop 36 signal F is logic low but inverted through inverter 41) which resets the flip-flop 35. As a result, the UP signal goes logic low. The falling edge of the UP signal triggers the flip-flop 36 which forces the Q output signal F to logic high. Signal F, once inverted through inverter 41, makes logic low which forces the output of the AND gate 43 (signal B) to go to logic low. Nothing happens until CLK2 goes logic low which resets flip-flop 36. Resetting flip-flop 36 brings signal F back to logic low). The sequence repeats itself until CLK1 comes in phase with CLK2. The end result is that the UP signal goes logic high from the rising edge of clock CLK1 until the rising edge of CLK2 thus giving an UP output when CLK1 is in advance of the VCO clock, CLK2.

The sequence of events that occur when the VCO clock (CLK2) is in advance of the reference clock (CLK1) is as follows. The rising edge of CLK2 triggers the flip-flop 37 which makes the DOWN signal go logic high. Subsequently, when CLK1 goes logic high, the output of the AND gate 44 goes logic high (at that time signal G is logic low but inverted through inverter 39), which resets the flip-flop 37. As a result, the DOWN signal goes logic low. The falling edge of the DOWN signal triggers the flip-flop 38 which forces the Q output signal G to logic high. Signal G, once inverted through inverter 39, makes logic low which forces the output of the AND gate 44 (signal D) to go to logic low. Nothing happens until CLK1 goes logic low which resets flip-flop 38. Resetting flip-flop 38 brings signal G back to logic low. From there the cycle repeats itself until both clocks are in phase. The end result is that the down signal goes logic high from the rising edge of clock CLK2 until the rising edge of CLK1 thus giving a DOWN output when the VCO clock CLK2 is in advance of the reference clock.

The sequence of events when both clocks are in phase is similar to the above case except that a very short pulse is generated on both outputs (UP and DOWN) thus giving a periodic indication that both clocks are in phase. The duration of that short pulse is directly related to the propagation delays of the comparator.

As can be understood from the above, the synchronous phase-frequency comparator 30 thereby compares two clock signals to produce a phase-frequency error signal encoded on its UP and DOWN output signals. A positive pulse on the UP output will indicate that the reference clock is in advance of the VCO clock, therefore resulting in a need for the VCO frequency to be increased. A positive pulse on the DOWN output will indicate that the VCO clock is in advance of the reference clock, therefore resulting in a need for the VCO frequency to be decreased.

By feeding the resulting UP and DOWN signals to an external integrator which controls the actual VCO frequency in the PLL the necessary adjustments will be done.

The comparator of the preferred embodiment has more predictable delays, especially when used in most field programmable gate arrays (FPGAs), since less programmable routing is in the feedback path. Furthermore, it follows that the use of flip-flops offers ease of synthesis since the flip-flop is well characterized as a building block element.

The register transfer level VHDL language code for implementing the synchronous phase-frequency comparator for phase locked loops in a field programmable gate array is as follows:

```
-- Inputs:
-- =======
--
-- clk1 - Reference clock
-- clk2 - VCO clock
-- reset - power-up reset signal
--
-- Outputs:
-- ========
--
-- up - Active high up pulse for the external loop filter
-- down - Active high down pulse for external loop filter
library IEEE;
use IEEE.std_logic_1164.all;
use IEEE.std_logic_arith.all;
library SYNOPSYS;
use SYNOPSTYS.bv_arithmetic.all;
entity phi_det is
    port (clk1,clk2,reset : in std_logic;
              up, down : buffer std_logic);
end phi_det;
architecture behavioural of phi_det is
signal fb1, fb2 : std_logic;
begin
    process (clk2,fb1,clk2,reset)
    begin
        if (clk2 = '1' and fb1 = '0') or reset = '1' then
            up <= '0';
        else
            if (clk1'event and clk1 = '1') then
```

-continued

```
            up <= not down;
        end if;
    end if;
end process;
process (clk2,up,reset)
begin
    if (clk2 = '0' or reset = '1') then
        fb <= '0';
    else
        if (up'event and up = '0') then
            fb1 <= '1';
        end if;
    end if;
end process;
-- down
    process (clk1,fb2,clk2,reset)
    begin
        if (clk1 = '1' and fb2 = '0') or reset = '1' then
            down <= '0';
        else
            if (clk2'event and clk2 = '1') then
                down <= not up;
            end if;
        end if;
    end process;
    process (clk1,down,reset)
    begin
        if (clk1 = '0' or reset - '1') then
            fb2 <= '0';
        else
            if (down'event and down = '0') then
                fb2 <= '1';
            end if;
        end if;
    end process;
end behavioural;
```

The invention may be embodied in other specific forms without departing from the spirit or essential characteristics thereof. The present embodiments are therefore to be considered as illustrative and not restrictive, the scope of the invention being indicated by the appended claims rather than by the foregoing description, and all changes that come within the meaning and range of equivalency of the claims are therefore intended to be embraced therein.

I claim:

1. A method of performing phase-frequency comparison comprising the steps of:
    (a) receiving first and second clock signals,
    (b) inputting said first and second clock signals to first and second logic AND gates,
    (c) comparing said signals by triggering two negative-edge triggered flip-flops and two positive-edge triggered flip-flops controlled by said first and second logic AND gates, and
    (d) providing a first output when said first clock signal is in advance of said second clock signal, and a second output when said second clock signal is in advance of said first clock signal.

2. A synthesizable, flip-flop based comparator for detecting a phase-frequency relationship between two clock signals, comprising:
    a) first and second AND gates with input terminals receiving first and second clock signals to be compared,
    b) first and second negative-edge triggered flip-flops receiving said first and second clock signals; and
    c) first and second positive-edge triggered flip-flops receiving said first and second clock signals, one of said positive-edge triggered flip-flops providing an output when said first clock signal is ahead of said second clock signal, the other positive-edge triggered flip-flop providing an output when said second clock signal is ahead of said first clock signal.

3. A synthesizable flip-flop based phase-frequency comparator for providing outputs when first and second clock signals are not in synchronism comprising:
    a first input terminal for receiving a first clock signal,
    a second input terminal for receiving a second clock signal,
    a first AND gate having an input connected to said first input terminal,
    a second AND gate having an input connected to said second input terminal,
    a first positive edge triggered D flip-flop having its clock input connected to said first input terminal,
    a second positive edge triggered D flip-flop having its clock input connected to said second input terminal,
    the Q output of said first positive-edge triggered D flip-flop being connected to a first output terminal for providing an UP signal indicating that said first clock signal is in advance of the said second clock signal,
    said Q output also being connected to a first inverter,
    said first inverter output being connected to the data input of said second positive-edge triggered D flip-flop,
    a third negative edge triggered flip-flop having its clock terminal connected to the Q output of said first flip-flop,
    the Q output of said third negative-edge triggered flip-flop being connected to a second inverter and said second inverter output being connected to an input of said second AND gate,
    the output of said second AND gate being connected to the reset terminal of said first positive-edge triggered flip-flop,
    the Q output of said second positive-edge triggered flip-flop being connected to a second output terminal for providing a DOWN signal indicating that said second clock signal is in advance of said first clock signal,
    the Q output of said second positive-edge triggered flip-flop also being connected to a third inverter,
    the output of said third inverter being connected to the data input of said first positive-edge triggered flip-flop,
    the Q output of said second positive-edge triggered flip-flop also being connected to the clock input of a fourth negative edge triggered flip-flop,
    the Q output of said fourth negative-edge triggered flip-flop being connected to the input of a fourth inverter,
    the output of the fourth inverter being connected to an input of said first AND gate,
    the output of said first AND gate being connected to the reset terminal of said second positive-edge triggered flip-flop,
    the second input terminal being connected to the clock terminal of said second positive-edge triggered flip-flop and to the reset terminal of said third negative-edge triggered flip-flop,
    the first input terminal being connected to the reset terminal of said fourth negative-edge triggered flip-flop,
    whereby said UP signal is preset at said first output terminal when said first clock signal is ahead of said second clock signal, and said DOWN signal is present at said second output terminal when said second clock signal is ahead of said first clock signal.

* * * * *